(12) United States Patent
Inatani

(10) Patent No.: US 8,884,166 B2
(45) Date of Patent: Nov. 11, 2014

(54) METHOD OF MANUFACTURING MULTI-LAYER CIRCUIT BOARD, AND MULTI-LAYER CIRCUIT BOARD

(71) Applicant: Fujikura Ltd., Tokyo (JP)

(72) Inventor: Yuji Inatani, Sakura (JP)

(73) Assignee: Fujikura Ltd., Tokyo (JP)

( * ) Notice: Subject to any disclaimer, the term of this patent is extended or adjusted under 35 U.S.C. 154(b) by 285 days.

(21) Appl. No.: 13/644,888

(22) Filed: Oct. 4, 2012

(65) Prior Publication Data

US 2013/0098662 A1   Apr. 25, 2013

(30) Foreign Application Priority Data

Oct. 21, 2011   (JP) .................................. 2011-232220

(51) Int. Cl.
*H05K 1/03* (2006.01)
*H05K 3/46* (2006.01)

(52) U.S. Cl.
CPC ............ *H05K 3/4697* (2013.01); *H05K 3/4611* (2013.01); *H05K 2201/0909* (2013.01); *H05K 2201/09127* (2013.01); *H05K 2203/0228* (2013.01); *H05K 2203/0264* (2013.01); *H05K 2203/1572* (2013.01)
USPC ............................................ 174/255; 29/840

(58) Field of Classification Search
USPC ..................... 174/250, 255–259; 29/830, 840
See application file for complete search history.

(56) References Cited

FOREIGN PATENT DOCUMENTS

JP   2009-158770 A   7/2009
JP   2010-206124 A   9/2010

*Primary Examiner* — Jeremy C Norris
(74) *Attorney, Agent, or Firm* — Westerman, Hattori, Daniels & Adrian, LLP

(57) ABSTRACT

A multi-layer circuit board having a connector portion of an inner layer substrate being exposed, the multi-layer circuit board comprising: an inner layer substrate in which an inner layer circuit is formed, the inner layer circuit including the connector portion; and an outer layer substrate having an outer layer circuit formed on an insulating layer and having a region corresponding to the connector portion peeled off, an inner layer circuit side of the inner layer substrate and an insulating layer side of the outer layer substrate being adhered to one another via an adhesive layer so as to face one another, and a conductor layer other than the connector portion of the inner layer circuit being adhered to the outer layer substrate directly by the adhesive layer.

6 Claims, 8 Drawing Sheets

Cross-Section Seen From The Direction of Arrow A

Cross-Section Seen From The Direction of Arrow A

METHOD OF MANUFACTURING MULTI-LAYER CIRCUIT BOARD, AND MULTI-LAYER CIRCUIT BOARD

CROSS-REFERENCE TO RELATED APPLICATIONS

This application is based upon and claims the benefit of priority from the prior Japanese Patent Application No. 2011-232220, filed on Oct. 21, 2011, the entire contents of which are incorporated herein by reference.

BACKGROUND OF THE INVENTION

1. Field of the Invention

The present invention relates to a method of manufacturing a multi-layer circuit board, and to the multi-layer circuit board.

2. Description of the Related Art

Regarding multi-layer circuit boards in which an inner layer substrate including an inner layer circuit and an outer layer substrate including an outer layer circuit are stacked, a method of manufacturing such a multi-layer circuit board that has a structure exposing a part of the inner layer circuit disclosed in Unexamined Japanese Patent Application Publication No. 2010-206124 A is known (refer to, Document 1). This multi-layer circuit board is manufactured as follows. That is, the outer layer substrate is stacked on a surface of a terminal exposure side of the inner layer circuit of the inner layer substrate, via an interlayer adhesive layer including an opening which is larger than an exposed portion of the terminal.

Moreover, a pair of slits is formed in the outer layer substrate at positions outside the opening of the interlayer adhesive layer so as to sandwich a portion eventually to be removed, and the outer layer circuit of the outer layer substrate is formed. Finally, a punching processing is implemented straddling the slits to expose a terminal portion of the inner surface circuit. In this way for manufacturing the multi-layer circuit board, a structure that the interlayer adhesive layer is attached a terminal side end of the slits is formed after stacking, then the slits are closed by the inter-layer adhesive layer. Thus making it possible to prevent intrusion of chemicals into the terminal portion while forming the outer layer circuit by etching, and so on.

SUMMARY OF THE INVENTION

However, in the conventional method of manufacturing disclosed in the above-mentioned Document 1, alignment of each of materials during actual manufacturing is difficult, hence whether intrusion of chemicals into the terminal portion can be reliably prevented or not is highly reliant on accuracy of alignment, resulting in a risk that costs rise and also yield falls.

Moreover, there is a problem that because stacking is performed after forming the opening in the interlayer adhesive layer, an overall substrate thickness of the opening portion is small compared to that of other portions, hence pressure is insufficient during stacking thereby generating irregularity in the outer layer substrate and thus making it difficult to form a minute outer layer circuit.

This invention has an object of solving the above-described problems arising from the conventional technology to thereby provide a method of manufacturing a multi-layer circuit board capable of improving yield while ensuring flatness of an outer layer substrate, easily and at low cost, and to provide the multi-layer circuit board.

A first method of manufacturing a multi-layer circuit board according to one embodiment of the present invention, the multi-layer circuit board having a part of an inner layer circuit being exposed, comprises: forming one or more first slit portions in an outer layer substrate so as to conform with an outer periphery of a region corresponding to a circuit exposure portion of an inner layer substrate, the outer layer substrate having a conductor layer formed on one surface of the outer layer substrate and an adhesive layer covered by an exfoliating paper formed on the other surface of the outer layer substrate, the inner layer substrate having at least a part of the inner layer circuit being exposed, and the one or more first slit portions each penetrating the outer layer substrate while not attaining a closed circuit state; forming a half cut portion, linked to the one or more first slit portions, in the exfoliating paper of the outer layer substrate, and peeling off and thereby removing the exfoliating paper other than a residual exfoliating paper such that the exfoliating paper in the region corresponding to the circuit exposure portion remains; stacking and curing the inner layer substrate and the outer layer substrate such that an inner layer circuit side of the inner layer substrate and an adhesive layer side of the outer layer substrate face one another and the residual exfoliating paper is positioned on the circuit exposure portion; forming an outer layer circuit in the outer layer substrate; forming one or more second slit portions in the outer layer substrate, the one or more second slit portions being linked to the one or more first slit portions; and peeling off a region surrounded by the first and second slit portions of the outer layer substrate as a whole with the residual exfoliating paper to thereby expose the circuit exposure portion.

Moreover, a second method of manufacturing a multi-layer circuit board according to another embodiment of the present invention, the multi-layer circuit board having a part of an inner layer circuit being exposed, comprises: applying a mask material to an adhesive layer of an outer layer substrate so as to correspond to a circuit exposure portion of an inner layer substrate, the outer layer substrate having a conductor layer formed on one surface of the outer layer substrate and the adhesive layer formed on the other surface of the outer layer substrate, the inner layer substrate having at least a part of the inner layer circuit being exposed, and the mask material having a size covering the circuit exposure portion; forming one or more first slit portions in the outer layer substrate so as to conform to a shape of the mask material, the one or more first slit portions each penetrating the outer layer substrate while not attaining a closed circuit state; stacking and curing the inner layer substrate and the outer layer substrate such that an inner layer circuit side of the inner layer substrate and an adhesive layer side of the outer layer substrate face one another and the mask material is positioned on the circuit exposure portion; forming an outer layer circuit in the outer layer substrate; forming one or more second slit portions in the outer layer substrate, the one or more second slit portions being linked to the one or more first slit portions; and peeling off a region surrounded by the first and second slit portions of the outer layer substrate as a whole with the mask material to thereby expose the circuit exposure portion.

The first and second methods of manufacturing a multi-layer circuit board according to embodiments of the present invention result in each of substrates being stacked via an interlayer adhesive layer while causing an exfoliating paper or a mask material to remain on a circuit exposure portion of an inner layer circuit of an inner layer substrate, without processing the adhesive layer. As a result, flatness of an outer layer substrate during stacking can be ensured, first slit portions are filled by the adhesive layer, and chemicals for etching never intrude into the circuit exposure portion during formation of an outer layer circuit of an outer layer substrate.

Moreover, the circuit exposure portion of the inner layer circuit is exposed by punching the outer layer substrate as a whole with the remaining exfoliating paper or mask material, hence the inner layer circuit can be exposed at low cost by an easy method. This allows yield of the multi-layer circuit board to be improved.

Note that in one embodiment in the first method of manufacturing according to one embodiment of the present invention, a residual exfoliating paper has an area larger than that of the circuit exposure portion.

Moreover, in another embodiment in the first method of manufacturing according to the present invention, one or more second slit portions are formed so as to encompass a half cut portion.

A multi-layer circuit board according to one embodiment of the present invention, the multi-layer circuit board having a connector portion of an inner layer substrate being exposed, comprises: an inner layer substrate in which an inner layer circuit is formed, the inner layer circuit including the connector portion; and an outer layer substrate having an outer layer circuit formed on an insulating layer and having a region corresponding to the connector portion peeled off, an inner layer circuit side of the inner layer substrate and an insulating layer side of the outer layer substrate being adhered to one another via an adhesive layer so as to face one another, and a conductor layer other than the connector portion of the inner layer circuit being adhered to the outer layer substrate directly by the adhesive layer.

Effects of the Invention

The present invention allows yield to be improved while ensuring flatness of an outer layer substrate, easily and at low cost.

DETAILED DESCRIPTION OF THE EMBODIMENTS

A method of manufacturing a multi-layer circuit board, and the multi-layer circuit board, according to embodiments of this invention are described in detail below with reference to the accompanying drawings.

First Embodiment

Figure 1:
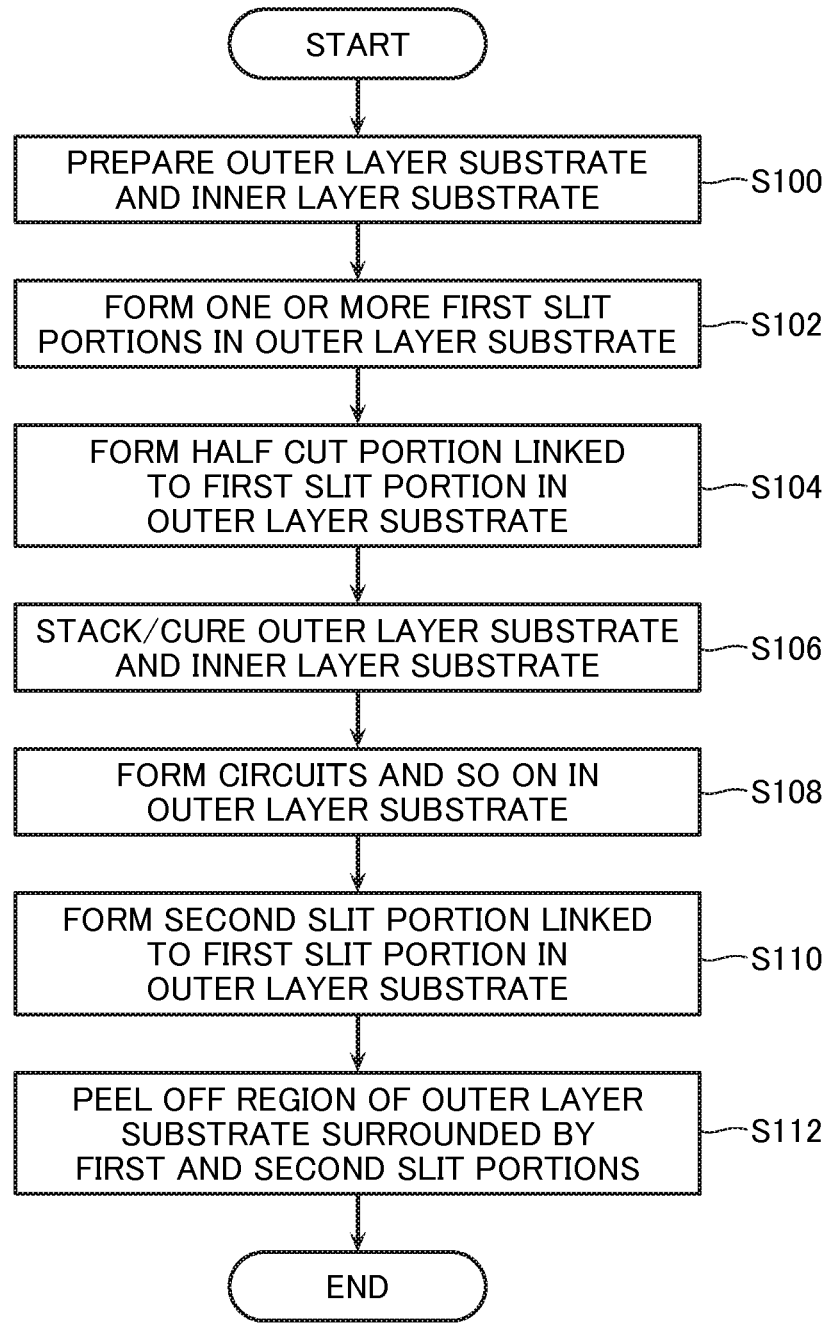
FIG. 1 is a flowchart showing manufacturing processes of a multi-layer circuit board according to a first embodiment of the present invention.
Figure 2A:
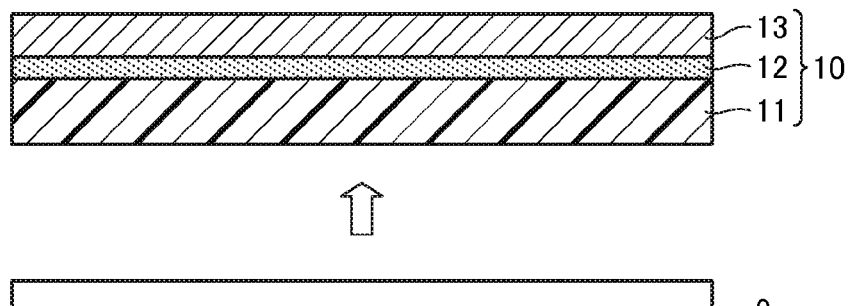
FIG. 2A is a cross-sectional diagram showing same multi-layer circuit board in sequence of manufacturing processes according to the first embodiment of the present invention.
Figure 3A:
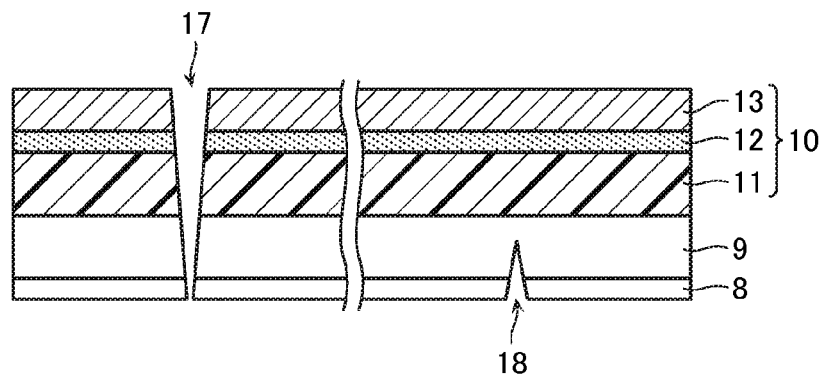
FIG. 3A is a cross-sectional diagram showing in enlargement a concept of part of manufacturing processes of same multi-layer circuit board according to the first embodiment of the present invention.
Figure 3B:
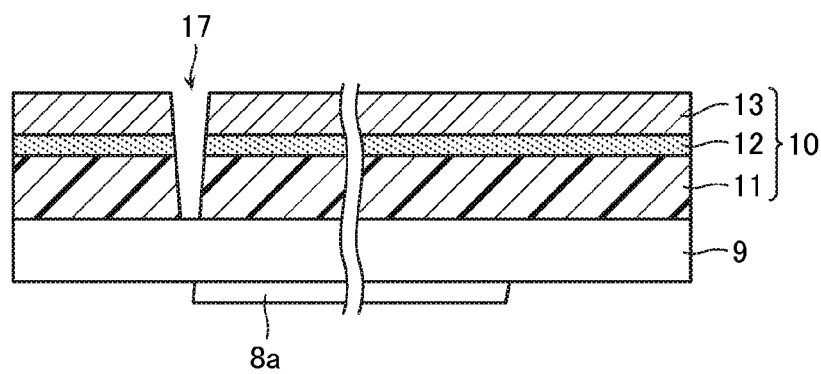
FIG. 3B is a cross-sectional diagram showing in enlargement a concept of part of manufacturing processes of same multi-layer circuit board according to the first embodiment of the present invention.
Figure 3C:
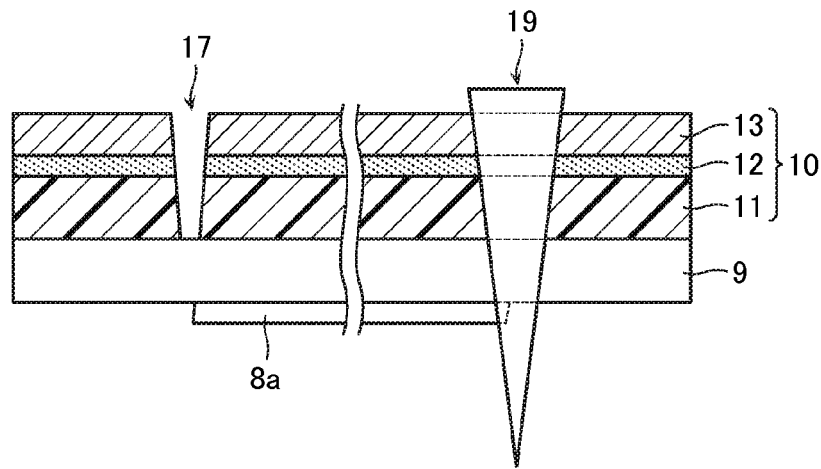
FIG. 3C is a cross-sectional diagram showing in enlargement a concept of part of manufacturing processes of same multi-layer circuit board according to the first embodiment of the present invention.
Figure 4A:
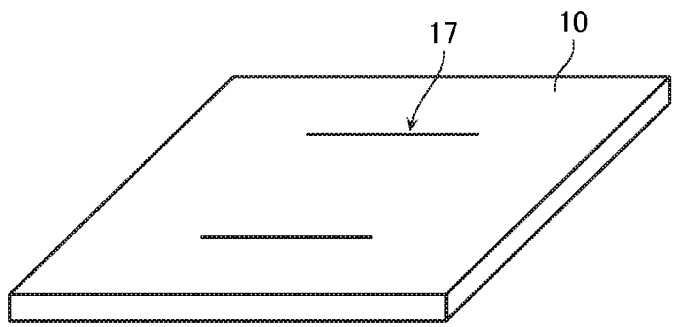
FIG. 4A is a perspective diagram showing a part of manufacturing processes of same multi-layer circuit board according to the first embodiment of the present invention.
Figure 4B:
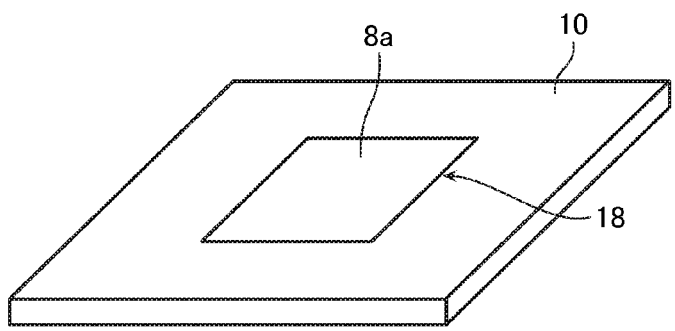
FIG. 4B is a perspective diagram showing a part of manufacturing processes of same multi-layer circuit board according to a first embodiment of the present invention.

FIG. 1 is a flowchart showing manufacturing processes of a multi-layer circuit board according to a first embodiment of the present invention. FIGS. 2A, 2B, 2C, 2D, 2E and 2F are cross-sectional diagrams showing this multi-layer circuit board in sequence of manufacturing processes. FIGS. 3A, 3B and 3C are cross-sectional diagrams showing in enlargement a concept of part of manufacturing processes of this multi-layer circuit board. FIGS. 4A, 4B, 4C and 4D are perspective diagrams showing a part of manufacturing processes of this multi-layer circuit board. FIG. 5 is a cross-sectional view showing a completed article of the multi-layer circuit board. First, as shown in FIG. 2A, an outer layer substrate 10 comprising a single-sided copper-clad laminate (single-sided CCL) having a conductor layer 13 of copper foil or the like applied to a base substrate 11 via an adhesive agent 12, is prepared.

The base substrate 11 is configured by a resin film, for example. The following may be employed as the resin film, namely, for example, a resin film comprising a thermoplastic polyimide, polyolefin, liquid crystal polymer, or the like, or a resin film comprising a thermosetting epoxy resin, and so on. The adhesive agent 12 comprises an epoxy or acrylic adhesive agent, or the like, or an organic adhesive agent having a volatile component, or the like. The conductor layer 13 may be configured by a metal member of gold, silver, aluminum, or the like, as well as by copper foil.

Next, as shown by the outline arrow in FIG. 2A, an adhesive layer 9, to which an exfoliating paper 8 is attached, is attached to a surface on a base substrate 11 side of the outer layer substrate 10. This results in preparation of an outer layer substrate 10 having the exfoliating paper 8 formed via the adhesive layer 9 on a surface of the outer layer substrate 10 on an opposite side to the conductor layer 13 sandwiching the base substrate 11 (step S100).

The exfoliating paper 8 is configured by a resin film such as a PET film able to withstand a temperature of about 150° C. to 170° C., or by an exfoliating paper attached beforehand to a metal member, a paper material, or an adhesive agent configuring the adhesive layer 9, and so on. Moreover, in order to regulate a thickness of the exfoliating paper 8, a configuration may be adopted to form the exfoliating paper 8 by printing using ink and so on.

Figure 2B:
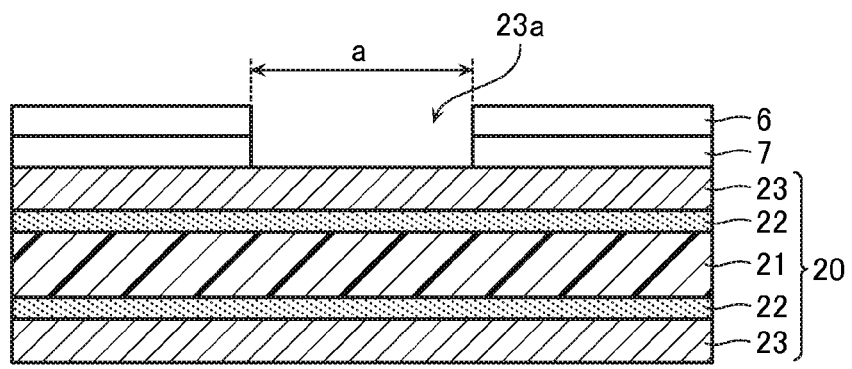
FIG. 2B is a cross-sectional diagram showing same multi-layer circuit board in sequence of manufacturing processes according to the first embodiment of the present invention.

Meanwhile, as shown in FIG. 2B, an inner layer substrate 20 is prepared. The inner layer substrate 20 has inner layer circuits 23 each configured by pattern forming of a conductor layer of copper foil or the like formed on both surfaces of a base substrate 21 via an adhesive agent 22. Moreover, a cover lay 6 is further attached via an adhesive agent 7 onto the inner layer circuit 23 on one surface side of the inner layer substrate 20, for example.

These cover lay 6 and adhesive agent 7 are removed at a certain place, hence, for example, a circuit exposure portion 23a of opening size a is formed in the inner layer substrate 20. A terminal due to the inner layer circuit 23 that is to become a connector portion, for example, is formed in this circuit exposure portion 23a. Moreover, the inner layer substrate 20 configured in this way is prepared along with the above-described outer layer substrate 10 (step S100). Note that the cover lay 6 comprises a resin film of the above-described kind, for example, and each other part configuring the inner layer substrate 20 is configured similarly to each part of the outer layer substrate 10.

Figure 2C:
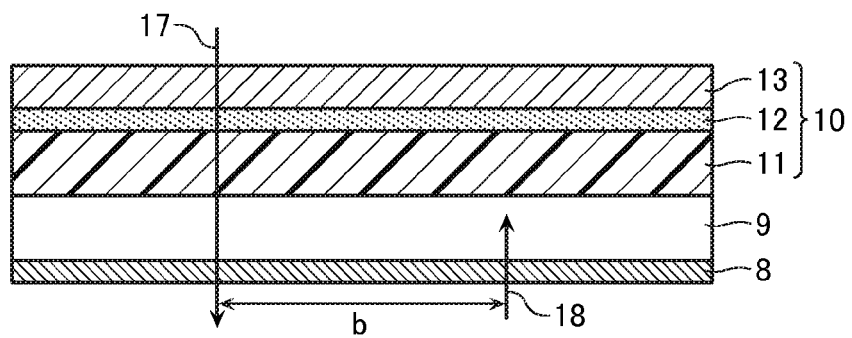
FIG. 2C is a cross-sectional diagram showing same multi-layer circuit board in sequence of manufacturing processes according to the first embodiment of the present invention.

Next, as shown by the straight line arrows in FIG. 2C, a Victoria or Thomson die cutter is employed to form one or more first slit portions 17 so as to conform with an outer periphery of a region of the outer layer substrate 10 corresponding to the circuit exposure portion 23a of the inner layer substrate 20 when stacked, the one or more first slit portions 17 each penetrating the outer layer substrate 10 from the conductor layer 13 side while not attaining a closed circuit state, for example (step S102). One example of this first slit portion 17 is shown in FIG. 4A. In this example, the first slit portions 17 are formed in two facing sides of four sides. Each of the first slit portions 17 is formed such that, as far as possible in design terms, no gap with the outer periphery of the above-described region is provided. However, the first slit portion 17 may be formed so as to provide a gap of about 0 mm to 0.3 mm due to fluidity of the adhesive layer 9 during stacking Then, a half cut die cutter or laser is employed to form a half cut portion 18, linked to (continuous with) the first slit portion 17, in the exfoliating paper 8 of the outer layer substrate 10 such that the exfoliating paper 8 in the region corresponding to the circuit exposure portion 23a remains (step S104). A size b of a region surrounded by these first slit portion 17 and half cut portion 18 is preferably larger than the opening size a.

The first slit portion 17 and half cut portion 18 are formed as shown in greater detail in FIG. 3A. That is, the first slit portion 17 is formed so as to penetrate, in a thickness direction, in order from the conductor layer 13 side as described above, the conductor layer 13, the adhesive agent 12, the base substrate 11, the adhesive layer 9, and the exfoliating paper 8. Therefore, a cutting end surface of the adhesive layer 9 and the outer layer substrate 10 in the first slit portion 17 are identical in the thickness direction.

Figure 2D:
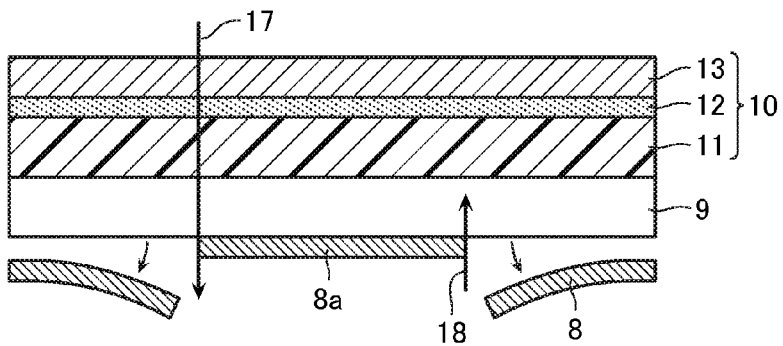
FIG. 2D is a cross-sectional diagram showing same multi-layer circuit board in sequence of manufacturing processes according to the first embodiment of the present invention.

On the other hand, the half cut portion 18 is formed so as to penetrate the exfoliating paper 8 in the thickness direction from an exfoliating paper 8 side of the outer layer substrate 10 and cut to around midway of the adhesive layer 9. Note that the half cut portion 18 may be formed cutting as far as the base substrate 11. If the first slit portion 17 and the half cut portion 18 are formed in this way, then, as shown in FIG. 2D and FIG. 4B, the exfoliating paper 8 other than a residual exfoliating paper 8a of the outer layer substrate 10 is peeled off and removed from the adhesive layer 9 as shown by the arrows in FIG. 2D.

Figure 2E:
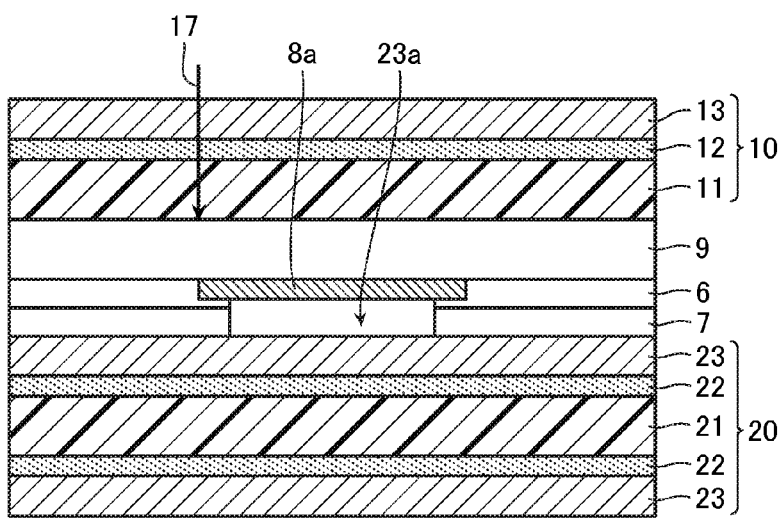
FIG. 2E is a cross-sectional diagram showing same multi-layer circuit board in sequence of manufacturing processes according to the first embodiment of the present invention.

Next, as shown in FIG. 2E, a circuit exposure portion 23a side of the inner layer substrate 20 and an adhesive layer 9 side of the outer layer substrate 10 are disposed facing one another and aligned such that the residual exfoliating paper 8a is positioned on the circuit exposure portion 23a, to stack and cure the outer layer substrate 10 and the inner layer substrate 20 (step S106).

At this time, because the adhesive layer 9 melts and then hardens, the first slit portion 17 and the half cut portion 18 achieve a filled state on an inside of the adhesive layer 9, as shown in FIG. 3B. That is, application of heat and pressure during stacking causes the adhesive layer 9 on the residual exfoliating paper 8a to flow into a periphery of the residual exfoliating paper 8a, hence the first slit portion 17 and the half cut portion 18 in the adhesive layer 9 are reliably blocked.

Moreover, since the residual exfoliating paper 8a is disposed on the circuit exposure portion 23a in a hollow state, there is no warping and so on of the outer layer substrate 10 due to pressure variations during stacking/curing, hence flatness of the substrate overall can be ensured. This enables circuit formation, masking processing and so on in the outer layer substrate 10 to be easily performed.

Note that alignment during stacking may be performed by a publicly known image analysis processing, or by, for example, during formation of the first slit portion 17, forming a locating pin in a near vicinity of an edge (for example, four corners) of the outer layer substrate 10 and forming a locating hole, into which this locating pin is inserted, in a near vicinity of an edge of the inner layer substrate 20, and then, during stacking, fitting together the locating pin and the locating hole.

Figure 2F:
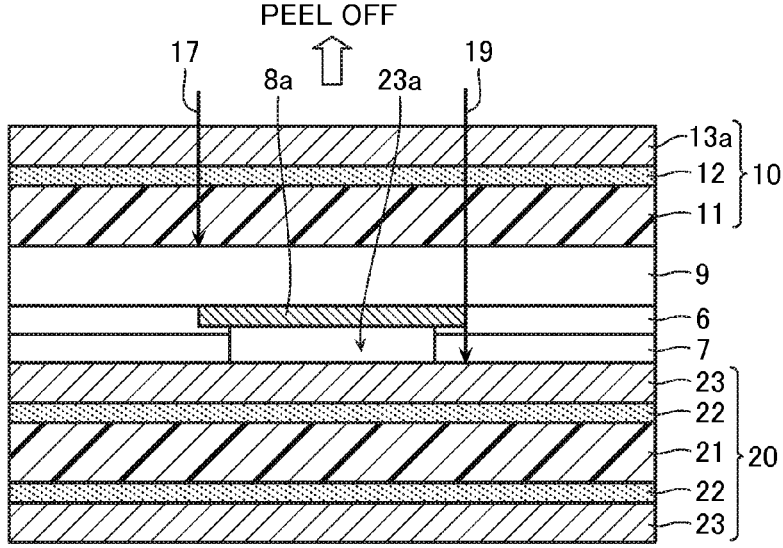
FIG. 2F is a cross-sectional diagram showing same multi-layer circuit board in sequence of manufacturing processes according to the first embodiment of the present invention.

Then, etching, through-hole processing, and so on, are implemented on the conductor layer 13 of the outer layer substrate 10 to form an outer layer circuit 13a (refer to FIG. 5) and so on (step S108), and, as shown in FIG. 2F, one or more second slit portions 19 linked to the one or more first slit portions 17 are formed in the outer layer substrate 10 (step S110).

Figure 4C:
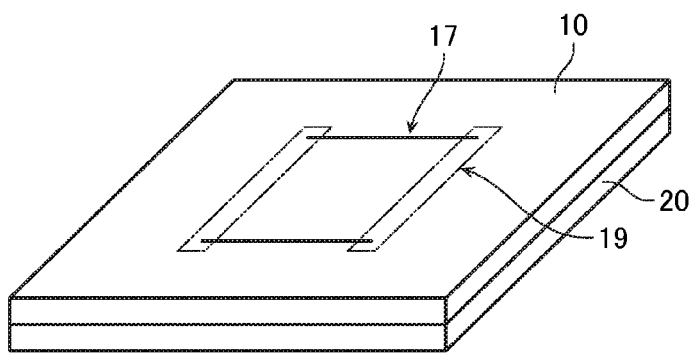
FIG. 4C is a perspective diagram showing a part of manufacturing processes of same multi-layer circuit board according to a first embodiment of the present invention.
Figure 5:
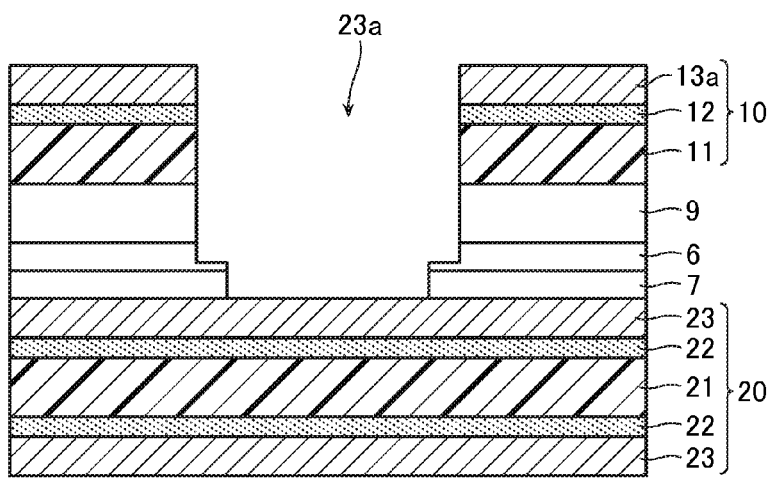
FIG. 5 is a cross-sectional diagram showing a completed article of same multi-layer circuit board according to the first embodiment of the present invention.

As shown in greater detail in FIG. 3C and FIG. 4C, these second slit portions 19 are formed in the thickness direction so as to encompass a portion where the half cut portion 18 was. Hence, it can be configured that no trace remains of the half cut portion 18 at time of completion of the multi-layer circuit board without the need for strict positioning accuracy in the thickness direction.

Figure 4D:
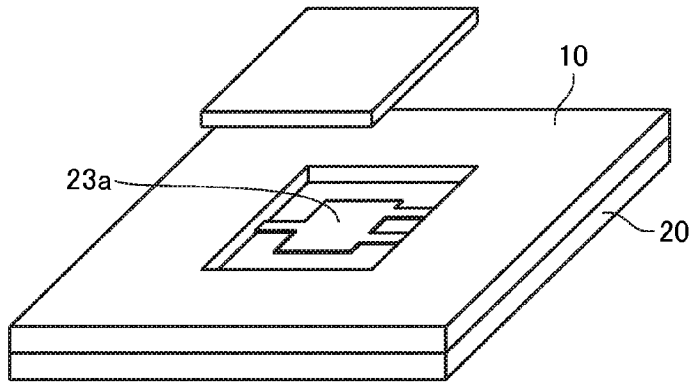
FIG. 4D is a perspective diagram showing a part of manufacturing processes of same multi-layer circuit board according to a first embodiment of the present invention.

Finally, as shown by the outline arrow in FIG. 2F and by FIG. 4D, a region surrounded by the first and second slit portions 17 and 19 of the outer layer substrate 10, that is, a region corresponding to the circuit exposure portion 23a of the inner layer substrate 20, is peeled off as a whole with the residual exfoliating paper 8a, whereby the multi-layer circuit board as shown in FIG. 5 is manufactured. The residual exfoliating paper 8a functions as a kind of reinforcing material of the portion peeled off, hence can be easily peeled off.

Second Embodiment

Figure 6:
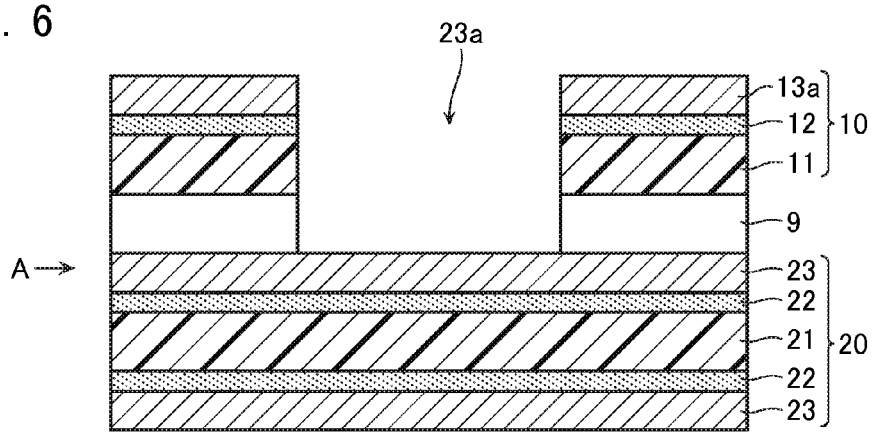
FIG. 6 is a cross-sectional diagram showing a multi-layer circuit board according to a second embodiment of the present invention.
Figure 7:
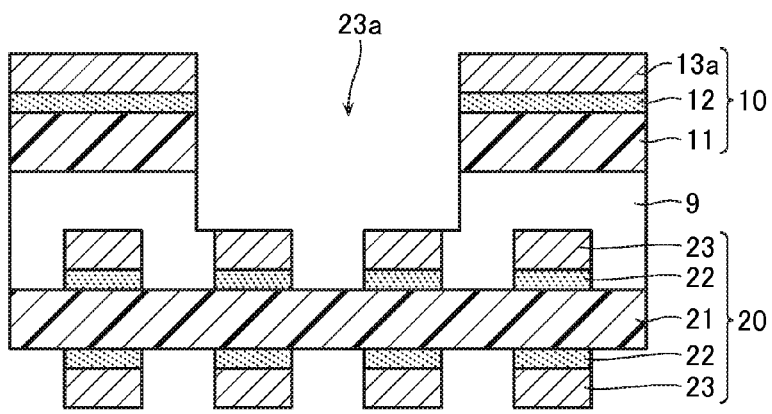
FIG. 7 is a cross-sectional diagram of FIG. 6 as seen from the direction of arrow A.
Figure 8A:
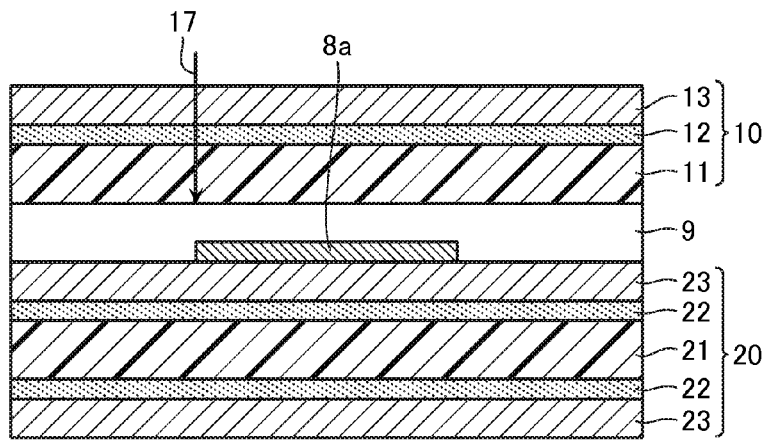
FIG. 8A is a cross-sectional diagram showing same multi-layer circuit board in sequence of manufacturing processes according to the second embodiment of the present invention.
Figure 8B:
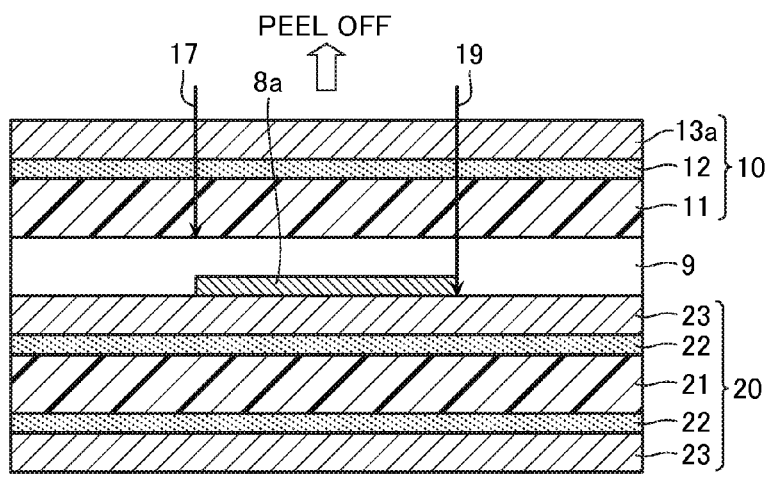
FIG. 8B is a cross-sectional diagram showing same multi-layer circuit board in sequence of manufacturing processes according to the second embodiment of the present invention.

FIG. 6 is a cross-sectional diagram showing a multi-layer circuit board according to a second embodiment of the present invention. FIG. 7 is a cross-sectional diagram of FIG. 6 as seen from the direction of arrow A. FIGS. 8A and 8B are cross-sectional diagrams showing the multi-layer circuit board in sequence of manufacturing processes. As shown in FIGS. 6 and 7, the multi-layer circuit board according to the second embodiment differs from the multi-layer circuit board according to the first embodiment in not having an adhesive agent 7 and a cover lay 6 provided on the inner layer circuit 23 of the inner layer substrate 20.

That is, as shown in FIGS. 6 and 7, in the multi-layer circuit board, the outer layer substrate 10 and the inner layer substrate 20 are stacked upon direct adhesion of the inner layer circuit 23 of the inner layer substrate 20 and the adhesive layer 9. The region where the residual exfoliating paper 8a (not illustrated) has been disposed beforehand on the adhesive layer 9 is peeled off finally as a whole with the outer layer substrate 10 to expose the inner layer circuit 23, whereby the circuit exposure portion 23a is formed.

The multi-layer circuit board according to the second embodiment configured in this way is manufactured basically by similar manufacturing processes to those of the multi-layer circuit board according to the first embodiment. First, an outer layer substrate 10 as described above provided with an exfoliating paper 8 is prepared, and an inner layer substrate 20 as described above in which an inner layer circuit 23 is formed is prepared.

Next, a first slit portion 17 and a half cut portion 18 of the kind shown in FIG. 2C are formed in the outer layer substrate 10, and, as shown in FIG. 2D, the exfoliating paper 8 is peeled off leaving the residual exfoliating paper 8a of the region corresponding to the circuit exposure portion 23a. Then, as shown in FIG. 8A, alignment is performed such that the residual exfoliating paper 8a is positioned on a portion that is to become the circuit exposure portion 23a of the inner layer circuit 23, and the outer layer substrate 10 and the inner layer substrate 20 are stacked and cured.

Then, the conductor layer 13 of the outer layer substrate 10 is processed to form the outer layer circuit 13a, and, as shown in FIG. 8B, having formed the second slit portion 19, a region of the outer layer substrate 10 corresponding to the circuit exposure portion 23a is peeled off as a whole with the residual exfoliating paper 8a as shown by the outline arrow in FIG. 8B, to thereby manufacture the multi-layer circuit board according to the second embodiment of the kind shown in FIG. 6 and FIG. 7.

This multi-layer circuit board according to the second embodiment, due to the cover lay 6 and the adhesive agent 7 not being provided on the inner layer circuit 23, is capable of suppressing thickness of the substrate overall, as well as displaying similar operational advantages to those of the multi-layer circuit board according to the first embodiment. Moreover, usually when a cover lay 6 is not provided, the adhesive layer 9 during stacking/curing becomes fluid, thus making it impossible to expose the inner layer circuit 23, but in the present embodiment, due to the existence of the residual exfoliating paper 8a, the problem of fluidity of the adhesive layer 9 does not occur, thus making it possible to expose the inner layer circuit 23. Therefore, exposure of the circuit exposure portion 23a can be performed while suppressing material costs.

Third Embodiment

Figure 9:
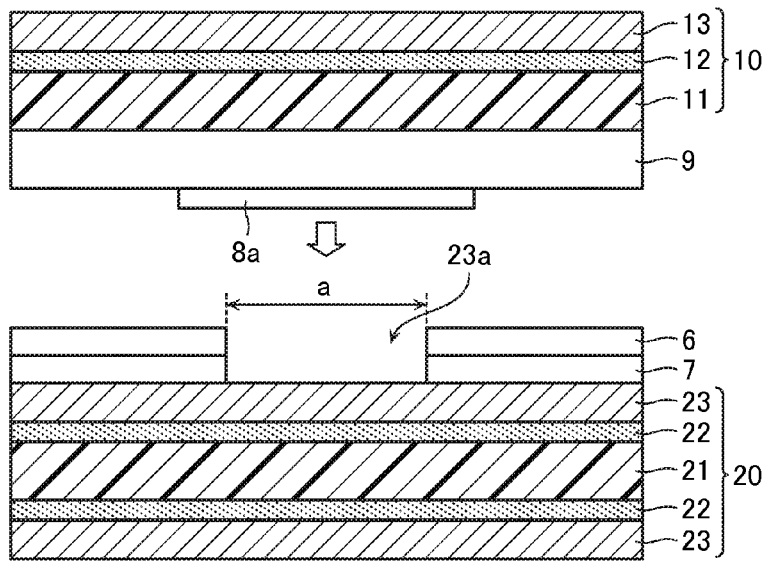
FIG. 9 is a cross-sectional views showing an outer layer substrate of a multi-layer circuit board according to a third embodiment of the present invention.
Figure 10:
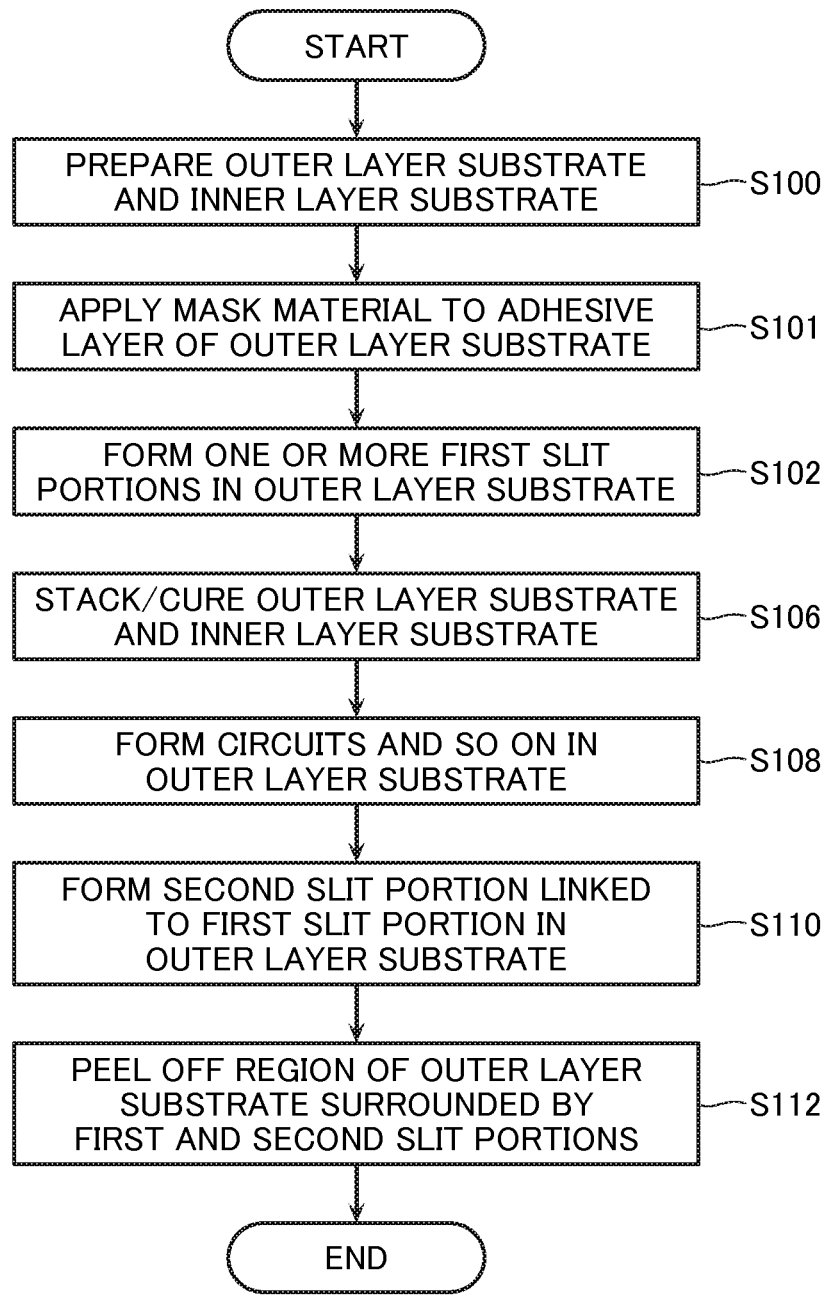
FIG. 10 is a flowchart showing manufacturing processes of the multi-layer circuit board according to the third embodiment of the present invention.

A method of manufacturing a multi-layer circuit board according to a third embodiment differs from the methods of manufacturing a multi-layer circuit board according to the first and second embodiments as follows. That is, in the method of manufacturing a multi-layer circuit board according to the third embodiment, as shown in FIG. 9, the exfoliating paper 8 provided in the outer layer substrate 10 is cut so as to cover the region corresponding to the circuit exposure portion 23a of the inner layer circuit 23 and attached to the adhesive layer 9, in advance. This differs from the methods of manufacturing a multi-layer circuit board according to the first and second embodiments. Note that masking tape or the like may be employed in place of the exfoliating paper 8 as a mask material. According to the embodiment, as shown in FIG. 10, step for applying a mask material having a size covering the circuit exposure portion 23a to the adhesive layer 9 of the outer layer substrate 10 so as to correspond to the circuit exposure portion 23a of the inner layer substrate 20 may be added (step S101). However, masking the circuit exposure portion 23a by the mask material removes the need for the process for forming the half cut portion 18 explained using the above-described step S104, FIG. 2C and so on, and removes the need for peeling off the exfoliating paper 8 other than the residual exfoliating paper 8a. Therefore, the number of manufacturing processes of the substrate overall can be reduced, thus enabling a reduction in costs to be achieved.

Other Embodiments

In addition, in the above-mentioned embodiments, the case was described where there are three circuit layers overall. However, multi-layer circuit boards having an even greater number of layers than three may also be manufactured using the method of manufacturing according to the present invention. For example, it is possible to manufacture a multi-layer circuit board where another outer layer substrate 10 is stacked similarly on an inner layer circuit 23 on another surface side of the inner layer substrate 20 and a circuit exposure portion 23a is formed on both outer layer substrate 10 sides, or to manufacture a multi-layer circuit board having an even greater number of inner layer substrates 20 and outer layer substrates 10 stacked exposing the circuit exposure portion 23a.

What is claimed is:
1. A multi-layer circuit board having a connector portion of an inner layer substrate being exposed, the multi-layer circuit board comprising:
   an inner layer substrate in which an inner layer circuit is formed, the inner layer circuit including the connector portion; and
   an outer layer substrate having an outer layer circuit formed on an insulating layer and having a region corresponding to the connector portion peeled off, an inner layer circuit side of the inner layer substrate and an insulating layer side of the outer layer substrate being adhered to one another via an adhesive layer so as to face one another, and a conductor layer other than the connector portion of the inner layer circuit being adhered to the outer layer substrate directly by the adhesive layer.

2. A method of manufacturing a multi-layer circuit board having a part of an inner layer circuit being exposed, the method comprising:

forming one or more first slit portions in an outer layer substrate so as to conform with an outer periphery of a region corresponding to a circuit exposure portion of an inner layer substrate, the outer layer substrate having a conductor layer formed on one surface of the outer layer substrate and an adhesive layer covered by an exfoliating paper formed on the other surface of the outer layer substrate, the inner layer substrate having at least a part of the inner layer circuit being exposed, and the one or more first slit portions each penetrating the outer layer substrate while not attaining a closed circuit state;

forming a half cut portion, linked to the one or more first slit portions, in the exfoliating paper of the outer layer substrate, and peeling off and thereby removing the exfoliating paper other than a residual exfoliating paper such that the exfoliating paper in the region corresponding to the circuit exposure portion remains;

stacking and curing the inner layer substrate and the outer layer substrate such that an inner layer circuit side of the inner layer substrate and an adhesive layer side of the outer layer substrate face one another and the residual exfoliating paper is positioned on the circuit exposure portion;

forming an outer layer circuit in the outer layer substrate;

forming one or more second slit portions in the outer layer substrate, the one or more second slit portions being linked to the one or more first slit portions; and peeling off a region surrounded by the first and second slit portions of the outer layer substrate as a whole with the residual exfoliating paper to thereby expose the circuit exposure portion.

3. The method of manufacturing a multi-layer circuit board according to claim 2, wherein the residual exfoliating paper has an area larger than that of the circuit exposure portion.

4. The method of manufacturing a multi-layer circuit board according to claim 3, wherein the one or more second slit portions are formed so as to encompass the half cut portion.

5. The method of manufacturing a multi-layer circuit board according to claim 2, wherein the one or more second slit portions are formed so as to encompass the half cut portion.

6. A method of manufacturing a multi-layer circuit board having a part of an inner layer circuit being exposed, the method comprising:

applying a mask material to an adhesive layer of an outer layer substrate so as to correspond to a circuit exposure portion of an inner layer substrate, the outer layer substrate having a conductor layer formed on one surface of the outer layer substrate and the adhesive layer formed on the other surface of the outer layer substrate, the inner layer substrate having at least a part of the inner layer circuit being exposed, and the mask material having a size covering the circuit exposure portion;

forming one or more first slit portions in the outer layer substrate so as to conform to a shape of the mask material, the one or more first slit portions each penetrating the outer layer substrate while not attaining a closed circuit state;

stacking and curing the inner layer substrate and the outer layer substrate such that an inner layer circuit side of the inner layer substrate and an adhesive layer side of the outer layer substrate face one another and the mask material is positioned on the circuit exposure portion;

forming an outer layer circuit in the outer layer substrate;

forming one or more second slit portions in the outer layer substrate, the one or more second slit portions being linked to the one or more first slit portions; and peeling off a region surrounded by the first and second slit portions of the outer layer substrate as a whole with the mask material to thereby expose the circuit exposure portion.

* * * * *